(12) United States Patent
Peyton et al.

(10) Patent No.: US 7,705,606 B2
(45) Date of Patent: Apr. 27, 2010

(54) NON-CONTACT CABLE STATE TESTING

(75) Inventors: Anthony Joseph Peyton, Bolton (GB);
Paul Colton, Lancaster (GB); Robert Mackin, Ingleton (GB); John Anthony Kelly, Morecambe (GB)

(73) Assignee: Lancaster University Business Enterprises Limited (GB)

( * ) Notice: Subject to any disclaimer, the term of this patent is extended or adjusted under 35 U.S.C. 154(b) by 270 days.

(21) Appl. No.: 11/597,575

(22) PCT Filed: May 12, 2005

(86) PCT No.: PCT/GB2005/001861

§ 371 (c)(1),
(2), (4) Date: Jan. 10, 2008

(87) PCT Pub. No.: WO2005/109015

PCT Pub. Date: Nov. 17, 2005

(65) Prior Publication Data

US 2008/0224712 A1    Sep. 18, 2008

(30) Foreign Application Priority Data

May 12, 2004   (GB)   ................... 0410682.9

(51) Int. Cl.
*G01R 31/11*   (2006.01)

(52) U.S. Cl. ........................... 324/533; 324/543
(58) Field of Classification Search ................. 324/539, 324/543, 533, 535
See application file for complete search history.

(56) References Cited

U.S. PATENT DOCUMENTS

| | | | |
|---|---|---|---|
| 4,325,022 A | 4/1982 | Pelletier | |
| 4,630,228 A | 12/1986 | Tarczy-Hornock et al. | |
| 5,565,783 A * | 10/1996 | Lau et al. | 324/522 |
| 5,589,776 A * | 12/1996 | Morant | 324/534 |
| 6,819,115 B1 * | 11/2004 | Keefe | 324/527 |
| 2002/0021676 A1 | 2/2002 | Richardson | |

FOREIGN PATENT DOCUMENTS

GB    2 062 250 A    5/1981

* cited by examiner

*Primary Examiner*—Vincent Q Nguyen
(74) *Attorney, Agent, or Firm*—Wood, Philips, Katz, Clark & Mortimer

(57) ABSTRACT

A method of determining the state of a cable including at least one electrical conductor, uses a generated test signal and applies it to at least one conductor by a non-contact coupling transmitter. The resulting signal is propagated along the at least one conductor and a non-contact electrical coupling receiver picks up a reflected signal, and compares the reflected signal to expected state signal values for the cable to determine its current state.

19 Claims, 16 Drawing Sheets

NON-CONTACT CABLE STATE TESTING

DESCRIPTION OF RELATED ART

The present invention relates to non-contact cable state testing.

It is particularly concerned with the monitoring of circuits such as, but not limited to, those used in data and telephone networks. Such circuits are typically implemented in a building by the provision of discrete cables installed between outlet ports, located around the building, and a central distribution area. Interconnections are made in the central distribution area between these cables and the various available services, enabling a device plugged into an outlet to access the required service. A typical cable contains a plurality of conductors comprising 4 twisted pairs.

Time domain reflectometry (TDR) is used widely by engineers in industry to find problems in cables and relies on the fact that transmission cables have resistive, inductive and capacitive properties. A signal transmitted down a line will be reflected back when a discontinuity is met due to a change in impedance. This feature can be used to form a cable tester by sending signals down a transmission line and looking at the waveform reflected back and the time it takes. The distance to the fault can then be calculated. However, these testers need to be electrically connected directly to the transmission line. In the case of testing network cables this poses some problems. Namely that any cable under test needs to be disconnected from, for example, the computer it is associated with and thus temporarily suspending a network connection to that computer. In a business that relies heavily on a network running at optimum capacity this may not be acceptable. A solution that eliminates this is required.

Furthermore, transmission characteristics for these cables are defined by various International Standards Bodies and therefore it is not possible to directly connect a monitoring device to such a circuit as this would alter its designed characteristics.

Within a central distribution area there may be a large number of cables, each with the possibility of connection to a large number of service ports. Once connected to a service port and with a device plugged into the outlet end, there are a finite number of states that the circuit can be in. These include the following: port connected and working; outlet device connected and working; cable damaged; cable disconnected from port; device connected to outlet but not powered up.

It is not currently possible to determine any or all of the states of a link, without physically going to each end of the link, disconnecting the circuit, testing the cable, and examining the connections.

It is an aim of the present invention to provide a solution to the above mentioned problem.

BRIEF SUMMARY OF THE INVENTION

Accordingly a first aspect of the invention provides a method of determining the state of a cable comprising at least one electrical conductor, in which method a test signal is generated and applied to at least one conductor of the cable by a non-contact electrical coupling transmitter, propagating the resulting signal along the at least one conductor and using a non-contact electrical coupling receiver to pick up a reflected signal, and comparing the reflected signal to expected state signal values for the cable to determine its current state.

Expected state signal value may include known values and predicted values. The invention provides a method of electrically coupling to a cable of a circuit without direct contact with it and therefore leaves the transmission characteristics virtually unaltered. In the case of a typical multi-core cable the reflected signal that is picked up will be that which is reflected by the plurality of conductors of that cable. Exceptionally, the aerial may be designed to generate a preferential signal in a selected one of the conductors of a multi-core cable or one of the pairs of conductors thereof. However, the monitoring of a single conductor is possible with the invention, at least for the case of a single core cable. The invention provides a method of passively listening to the signals on a cable comprising at least one conductor. The fundamental and harmonic frequencies of the signal can be used to determine what signal protocol is being used, e.g. 10 base T, 100 base T, etc, and indicate cables containing conductors that might be prone to error, signal loss or bit errors, etc. and consequently enable a view to be taken on the state of a line. The amount of bounce back of the reflected signal may indicate the number of pairs of wires in use of a cable.

Preferably the test signal has an expected signature. At least one expected state signal value is preferably stored in memory means. This may be the signature for the 'empty' state of the line under test. i.e. for a cable having terminations at each end but otherwise unconnected. More preferably, a set of expected state signal values for the circuit cable are preferably stored in memory means, with each signal of the set representing a specific state for the respective conductors of the cable in question. That signal may be the 'empty' signature for all the conductors of the cable in question. There may be a sub-set of expected state signal values for each conductor representing for example, port connected and working; outlet device connected and working; cable damaged; cable disconnected from port; device connected to outlet but not powered up. The signatures, other than for the 'empty' state, may be derived from expected signal values rather than measured reference values. The expected state signal values may be suitably encoded for storage and/or comparison purposes with the received reflected signals. The received reflected signals may be encoded for storage and/or comparison purposes. Preferably the comparison is carried out automatically by suitable programming of the test circuitry. By means of the invention a circuit state can be classified from a pre-defined list of possible states.

In order to extract information from the received signals on the state of the network or system of which the cable is a part, the signals may be passed to a signal processing unit, such as a computer.

The means for applying a signal to the at least one conductor of the cable conveniently comprises an antenna/aerial that is placed adjacent to the circuit under test. More particularly it comprises a wideband aerial.

The test signal may be frequency based or time based, or a combination of both.

The non-contact electrical coupling receiver is preferably an aerial. It may be the same aerial as that which is used to input the signal to the conductor or it may be a separate aerial. Several aerials may be used for each cable. Where a plurality of cables are involved in the network, which will usually be the case, a plurality of transmitters and receivers or transmitter/receivers are preferably employed. By transmitting on each cable, in turn, and 'listening' on all other receivers during transmission it is possible to identify the interconnection of a cable to a port within the central distribution area and to determine the state of the cable from the information supplied and received. Thus the invention provides a non-intrusive, non-contact method for network diagnosis.

The apparatus for use in the method may be portable apparatus that is manually positioned adjacent a cable to be tested, or it may be permanently installed as part of the network system. The latter is particularly advantageous as it makes possible, using suitable interfaces, remote network system evaluation. This may be performed off site using a data link, or from a central location on site. Whichever system is used a calibration procedure usually has to be carried out to arrive at a set of known state signal signatures representing the various cable states. In order to be able to correlate the results of a subsequent test procedure with the known state signal signatures the position at which the signal is input for generating the known state signatures and at which it is input for the subsequent testing must be the same.

Another aspect of the invention provides apparatus for determining the state of a cable comprising at least one conductor comprising a non-contact electrical coupling transmitter, means for generating a test signal for transmission by the non-contact electrical coupling transmitter to generate a signal on the at least one conductor of the cable under test, and a non-contact electrical coupling receiver for receiving a reflected signal from the cable under test, and means enabling determination of the received signal.

The means enabling determination of the received signal may comprise means to display the signal in a form that enables it to be compared with signals representing known conductor cable states. This may be graphically or numerically. However the apparatus preferably further comprises means for storing at least one expected state signal value, and preferably a series of expected state signal values corresponding to a series of expected conductor/cable states, and means for comparing the received reflected signal with the series of expected state signal values to determine the state of the cable under test.

The transmitter and receiver may utilize discrete aerials or share a common aerial. Signal processing may be carried out by a microprocessor under software control. Digital signal processing may be used to carry out an assessment of the received reflected signal and the comparison with the stored expected state signal signatures. For the application to a typical network system, the apparatus usually comprises a plurality of transmitter/receiver units and associated aerials operating in conjunction with one or more processors and a supervisory unit. More particularly the hardware comprises a transceiver to inject and receive the signals, and digital signal processing means to interpret the signal/information received.

BRIEF DESCRIPTION OF THE DRAWINGS

The present invention will now be described further hereinafter, by way of example only, with reference to the accompanying drawings: in which.

DETAILED DESCRIPTION OF THE INVENTION

Figure 1:
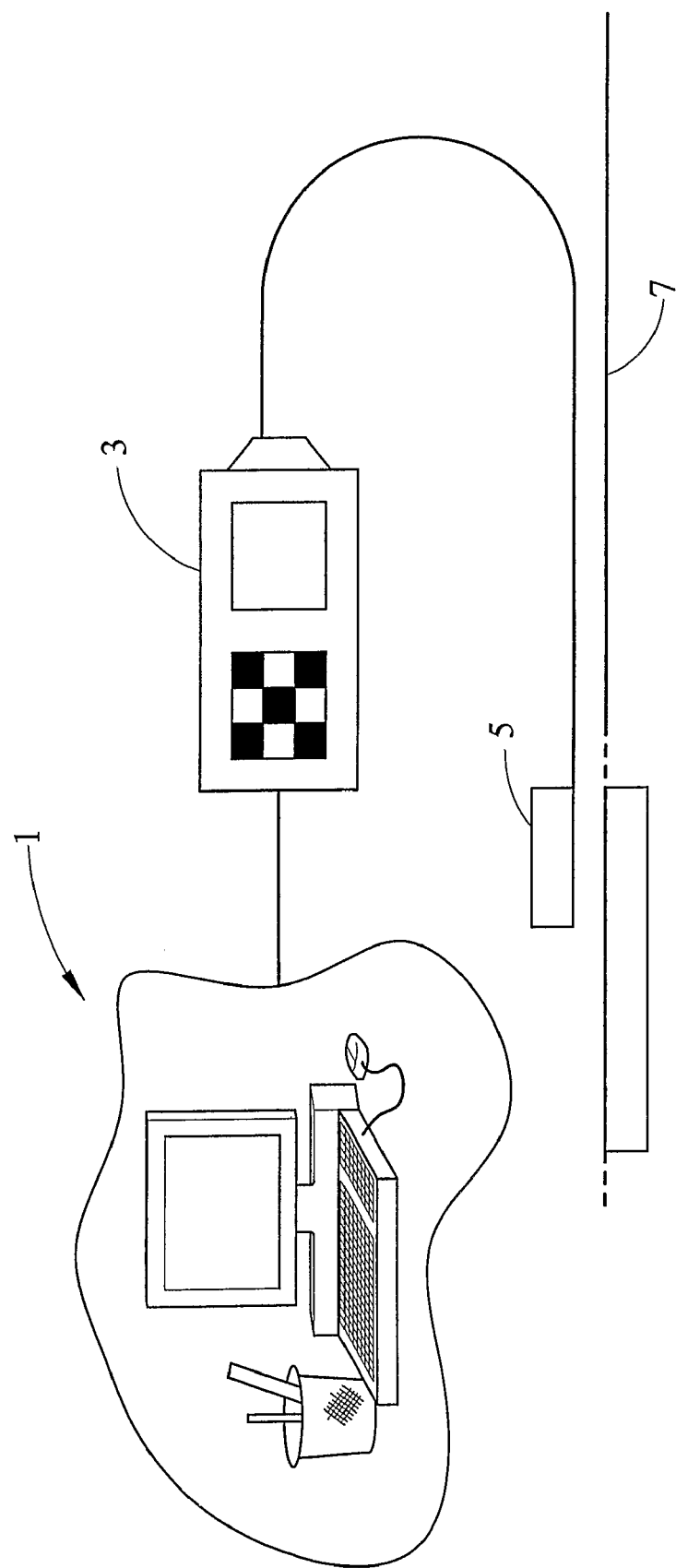
FIG. 1 is a perspective view of apparatus for implementing the invention according to one embodiment.

Referring firstly to FIG. 1, a computer, keyboard, mouse and display are shown at 1. A signal generator and receiver is shown at 3 and an antenna at 5. The antenna 5 is connected to the signal generator and receiver 3 that is connected to the computer 1. A cable under test is shown at 7. For the purposes of the illustration the cable is shown as a free length of cable. In practice it will be incorporated into a cabling system. The signal generator and receiver is used to generate a test signal that is applied to the cable under test via the antenna. The antenna generates a signal in the conductor or conductors of the cable under test without any direct electrical contact therewith. The antenna 5 is also used to pick up a reflection of the input signal, which is relayed to the signal generator and receiver 3. The computer is loaded with a software package that is used to observe the reflected pulses in the cable under test and present the resulting reflection as a graph. The test signal comprises a frequency swept pulse and/or a time domain pulse and the resulting signature is plotted in the frequency domain and/or the time domain. One or other of these signatures or both can be used to determine the state of at least one conductor of the cable under test.

Figure 2:
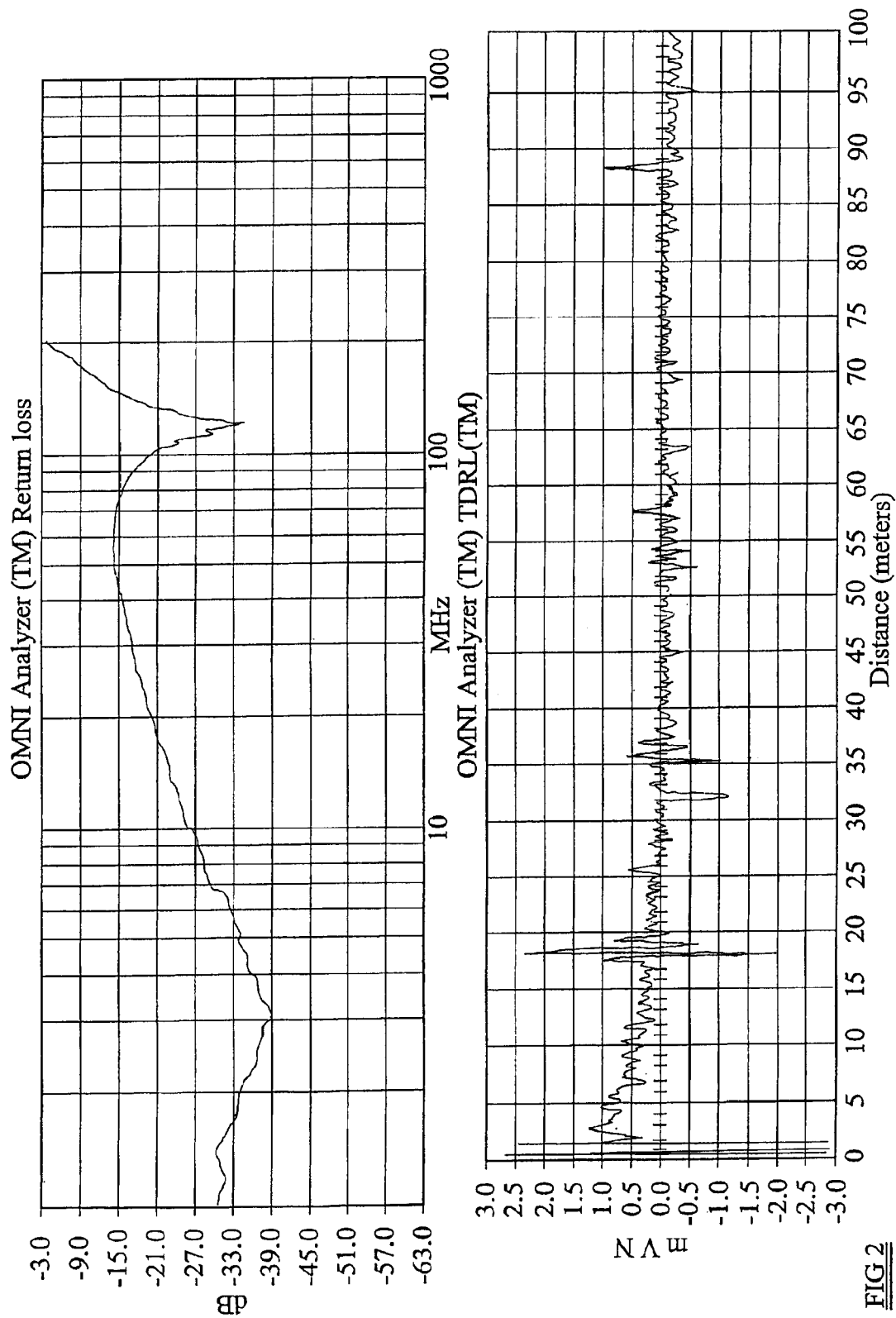
FIG. 2 consists of two graphs showing return loss by frequency and distance.

FIG. 2 shows two graphs showing the return loss for received pulses in time and frequency domains.

It will be apparent how, once the state signatures are known for any particular conductor or cable, the results of a subsequent test carried out on that conductor or cable using the same input signal can be used to determine the state of that conductor or cable and its conductors by comparison with the known state signatures. These could be hardcopies of the plots that are compared with the test plot. More preferably, the signal signatures representing the different states for the conductor or cable under test are stored in memory and digital signal processing used to compare the test signal with the stored signals. If a likely match is found then the state of the conductor or cable under test can be assumed to correspond to the state of the matching signature.

Figure 3:
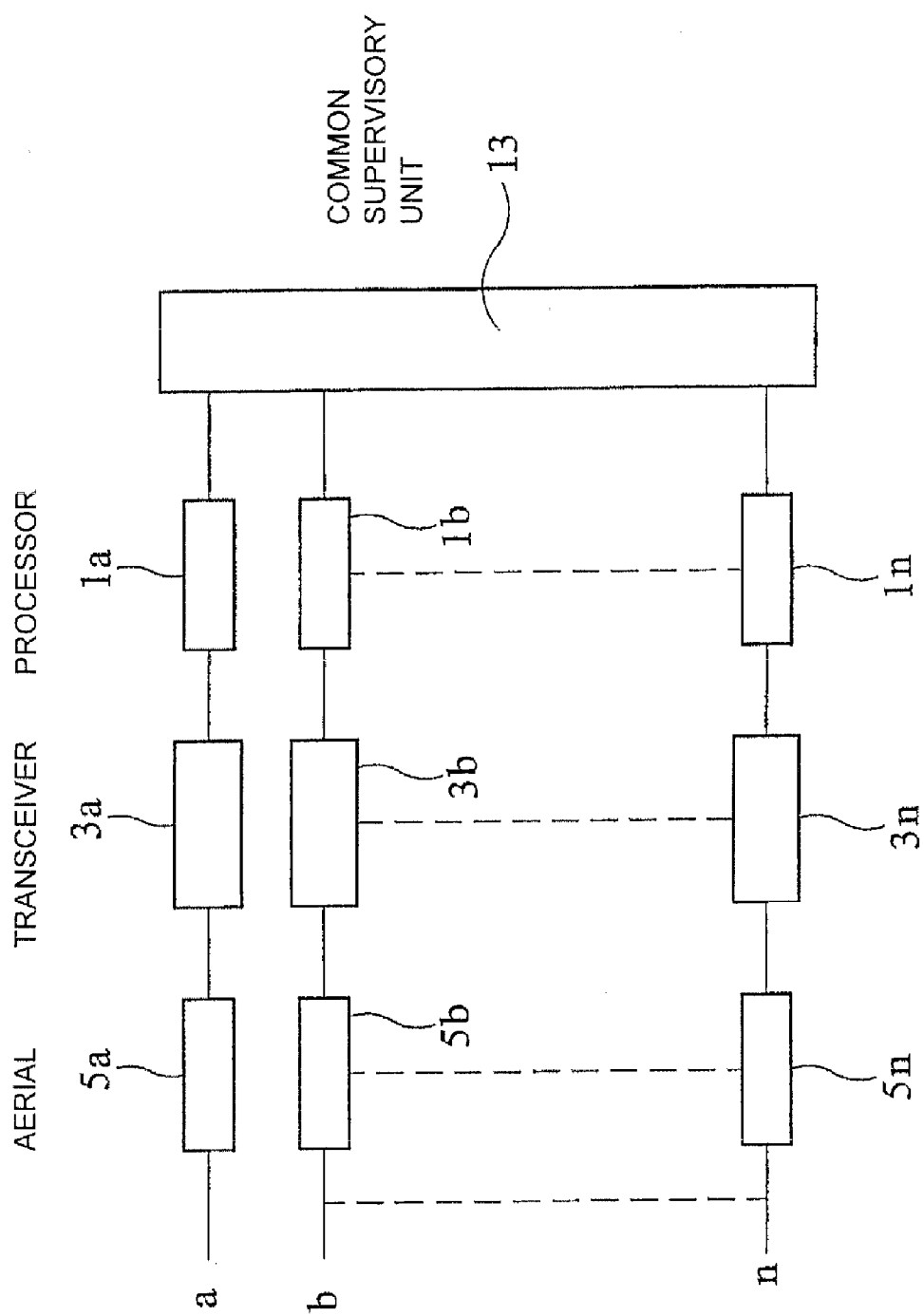
FIG. 3 is a schematic diagram of apparatus according to another embodiment of the invention.
Figure 4:
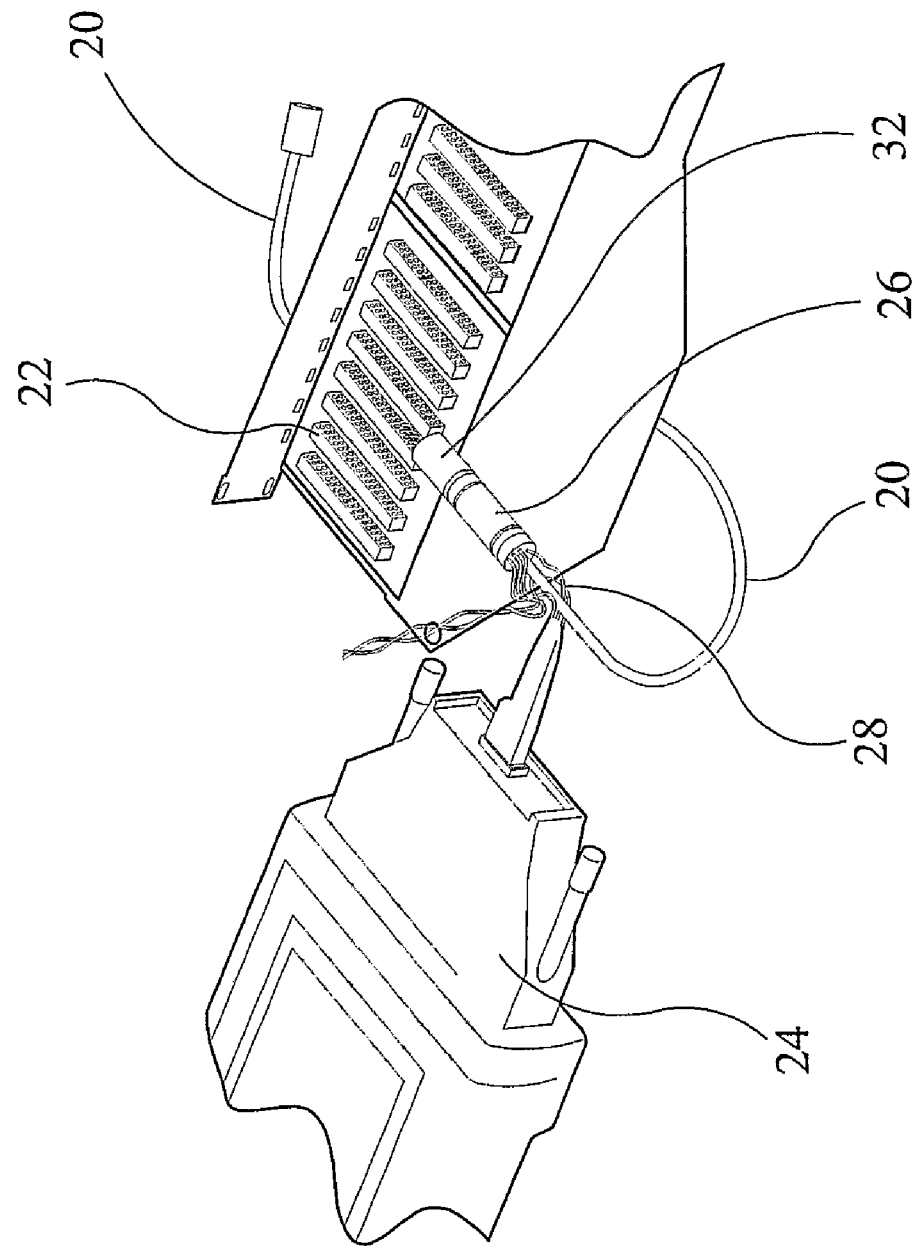
FIG. 4 shows another set up according to the invention.

FIG. 3 illustrates how the invention may be applied to a network cable system where there are 'n' cables whose state has to be monitored. The apparatus comprises a plurality of aerials 5a, 5b ... 5n each associated with a respective cable a, b ... n and connected to a respective transceiver 3a, 3b ... 3n which in turn is shown connected to a respective processor 1a, 1b ... 1n. In an alternative there may be a single processor to which all the transceivers connect. The processors are shown connected to a common supervisory unit 13. It is envisaged that for such network applications the aerials are permanently attached to the network cables. The supervisory unit may be located remote from the network location and connected to the processor(s) via any suitable interface.

In order to be able to determine the state of any of the network cables, a series of reference signatures are generated for the cables. Since the characteristics of the cable, such as length and type of cable, terminating impedances, etc. have a significant effect on the signature, it may be possible to arrive at a series of expected signatures from a basic reference signatures without having to replicate all the connection possibilities for each cable.

The graphs of FIG. 2 represent the application of the invention to CAT 6 Ethernet cabling having 4 twisted pairs. The antenna is designed to induce a signal in a particular conductor wire. One antenna may be used to induce a signal in all the wires of the cabling or a separate antenna may be used to induce a signal in a respective wire thereof. The length of the antenna may be configured to a particular number of twists of the twisted pairs to obtain the best signal on the conductors. The distance of the antenna from the conductors under test is chosen to optimise signal input and sensing. The antenna may utilize twisted wire pairs and preferably the period of the twists and the alignment thereof is matched to those of the conductor wires under test.

The invention is considered applicable to cabling of at least the following types, namely: Ethernet family of computer network cables, 10 baseT, 100 base T and 1 gigabit; Digital voice and analogue voice. However this is not to exclude the application to other signal protocols. The invention may also be applied to live or non-live power transmission conductor cables.

FIGS. 4 to 11 of the accompanying drawings illustrate a practical example of the invention. This example is of tests carried out on a 50 m CAT 6 utp cable 20 terminated at one end onto a patch panel 22 and into an outlet at the other end. The instrument used for the tests was an Omniscanner Cable Analyser 24, which injects a frequency sweep into antennae 26 associated with the cable under test and records any returned signals.

The antennae were made from two pairs of wires 28 of a fly lead 30 cut down and partially untwisted. The cable termination at the patch panel has each pair of wires passed through a short length of sheaving 32 and the antennae wires are each inserted into a piece of sheaving.

Figure 5A:
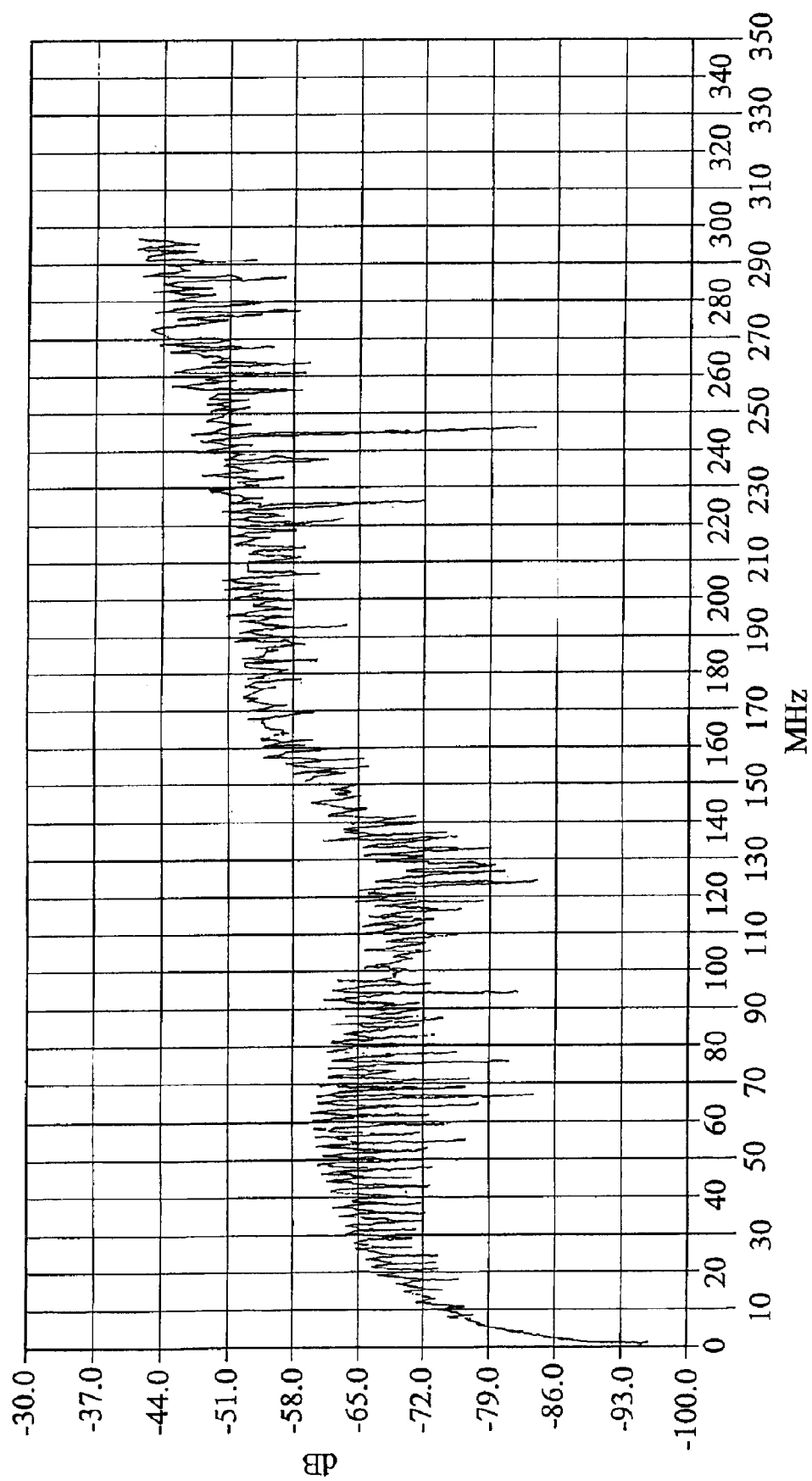
FIGS. 5a and 5b shows reference traces using the set up of FIG. 4.
Figure 5:
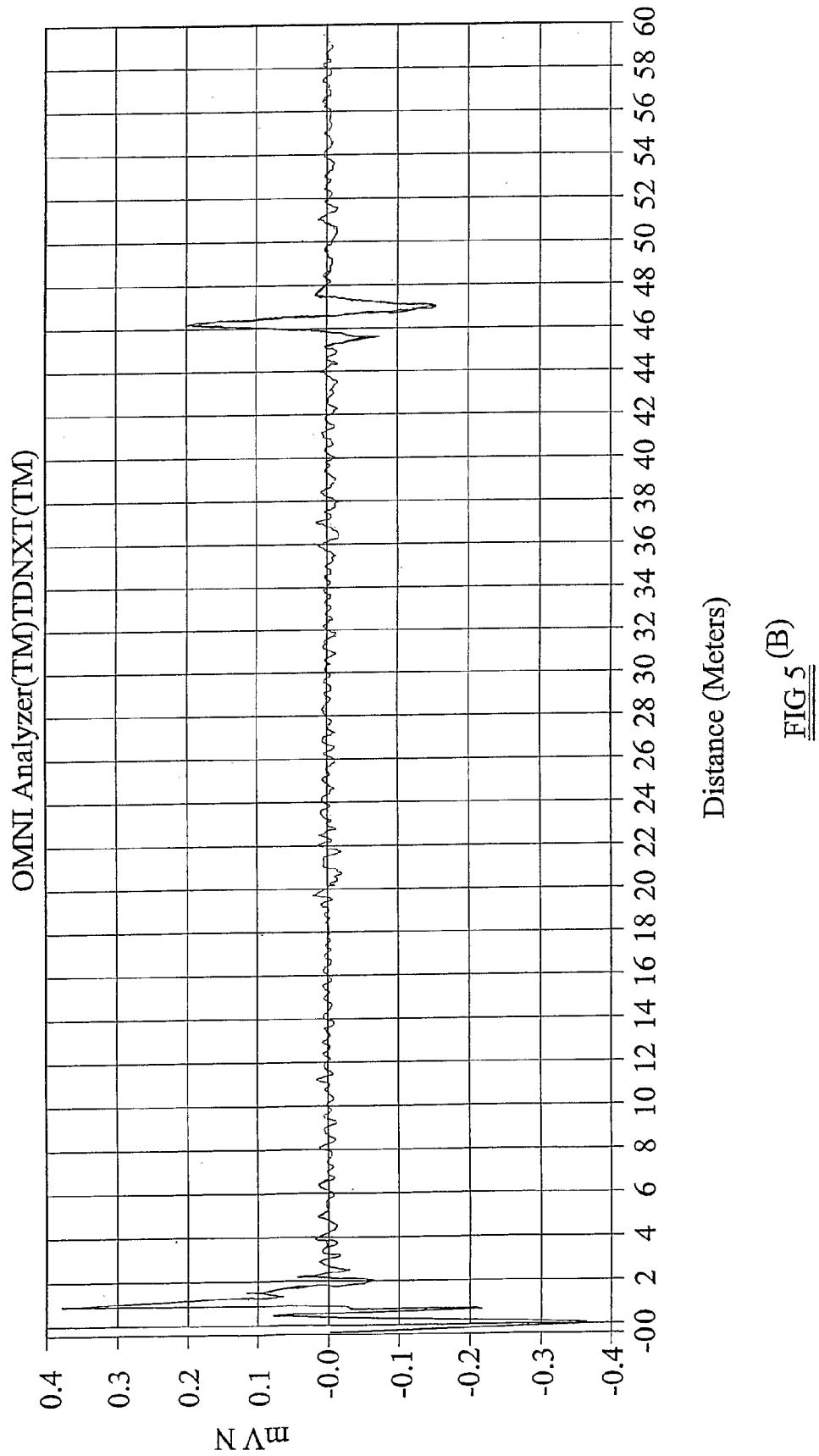
Figure 6:
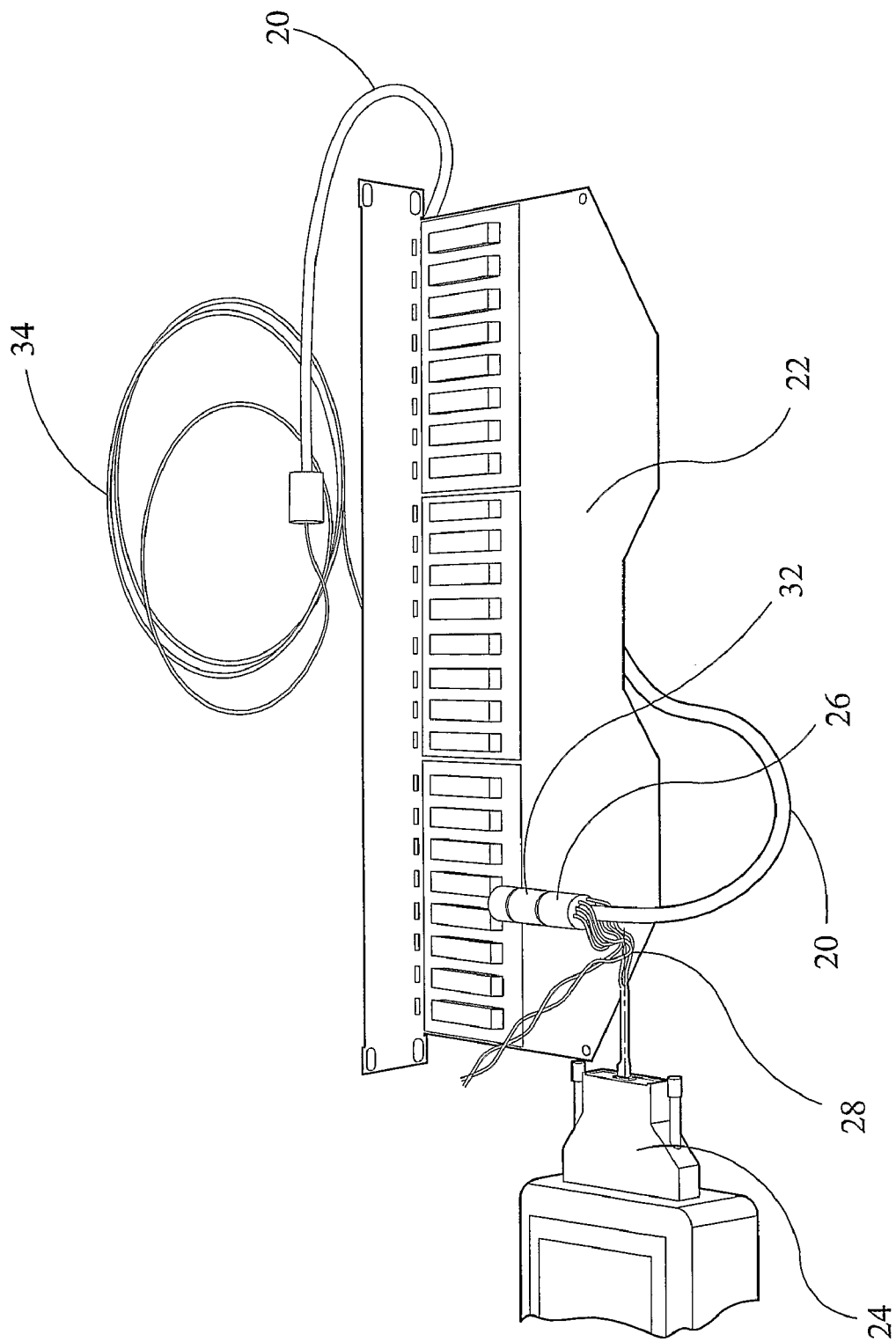
FIG. 6 shows a modification to the setup of FIG. 4.

The first test was carried out on the cable in its unconnected state and the results are shown in FIGS. 5a and 5b, which are respectively frequency and time domain responses. As can be seen from the time domain plot, the cable is showing a length of about 47 m.

Figure 7A:
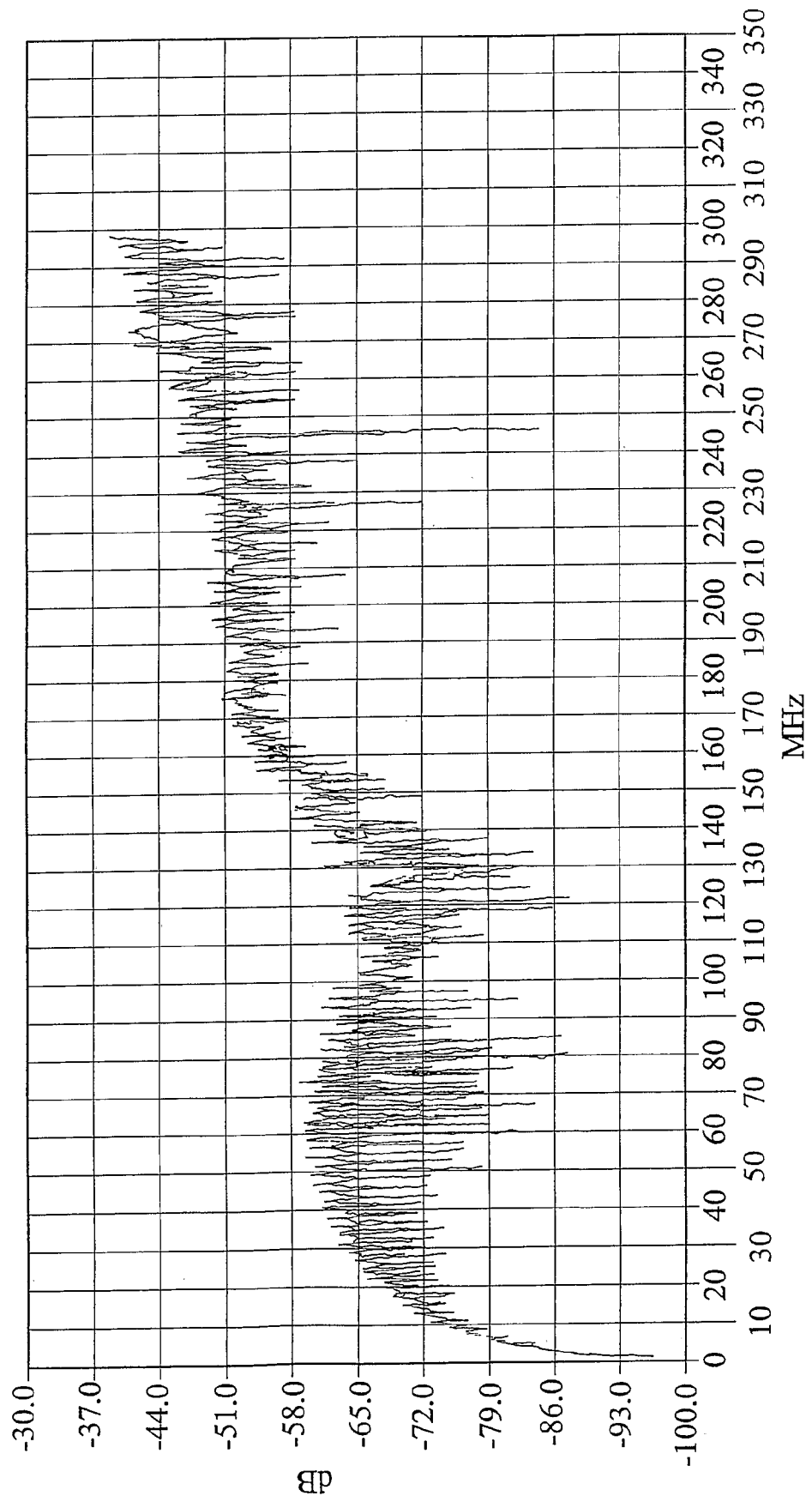
FIGS. 7a and 7b shows traces using the set up of FIG. 6.
Figure 7:
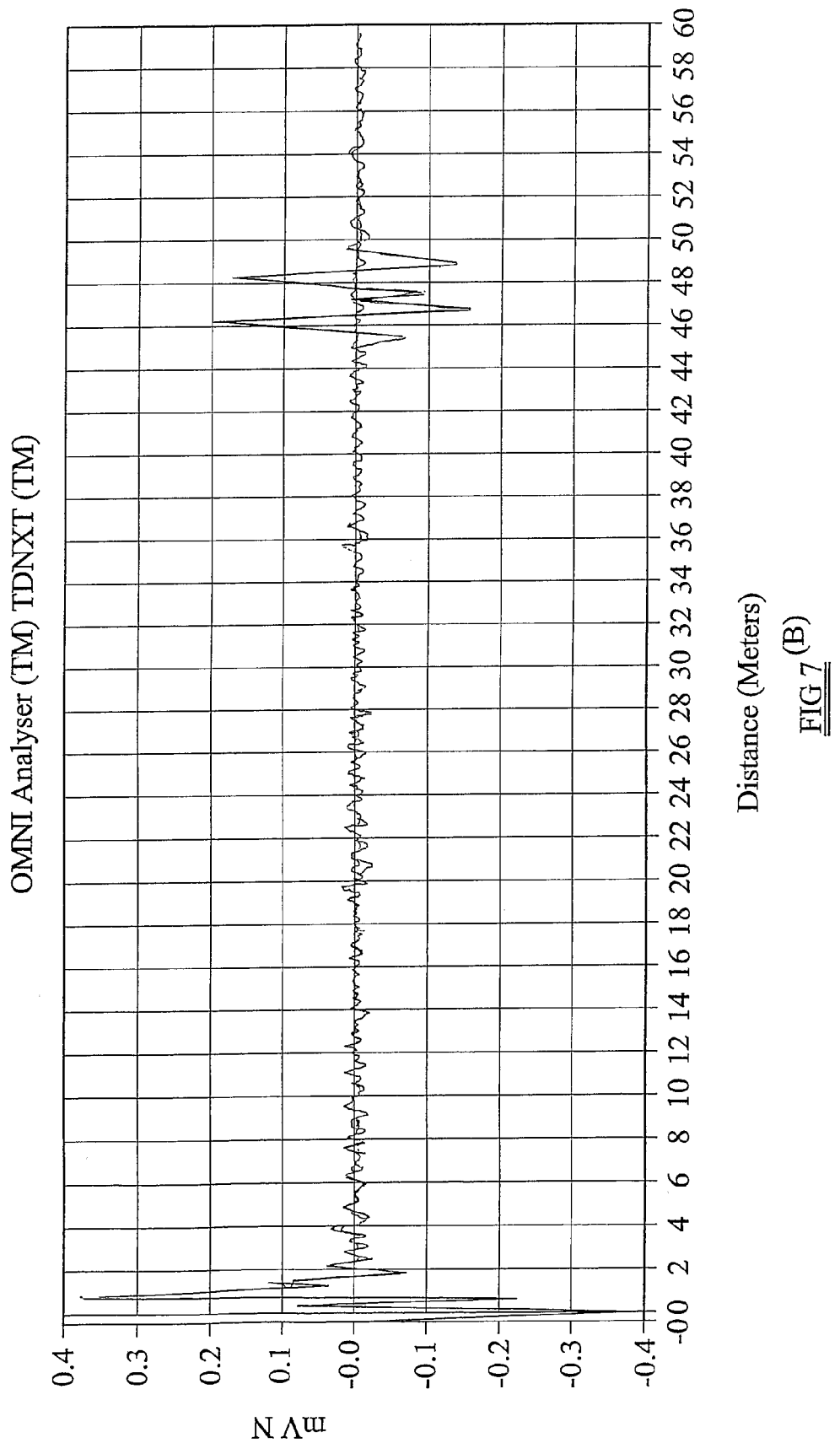
Figure 8:
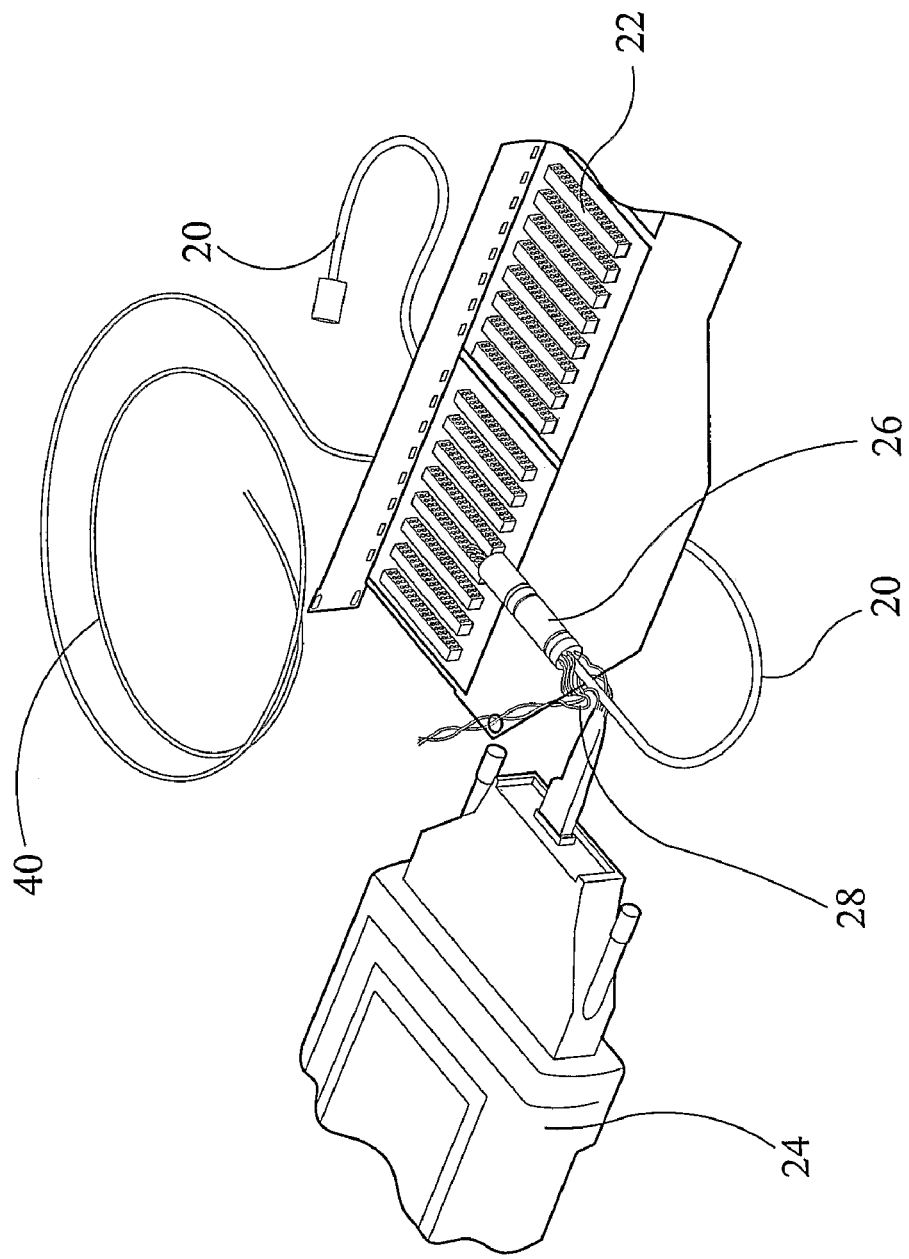
FIG. 8 shows a second modification to the set up of FIG. 4.
Figure 9:
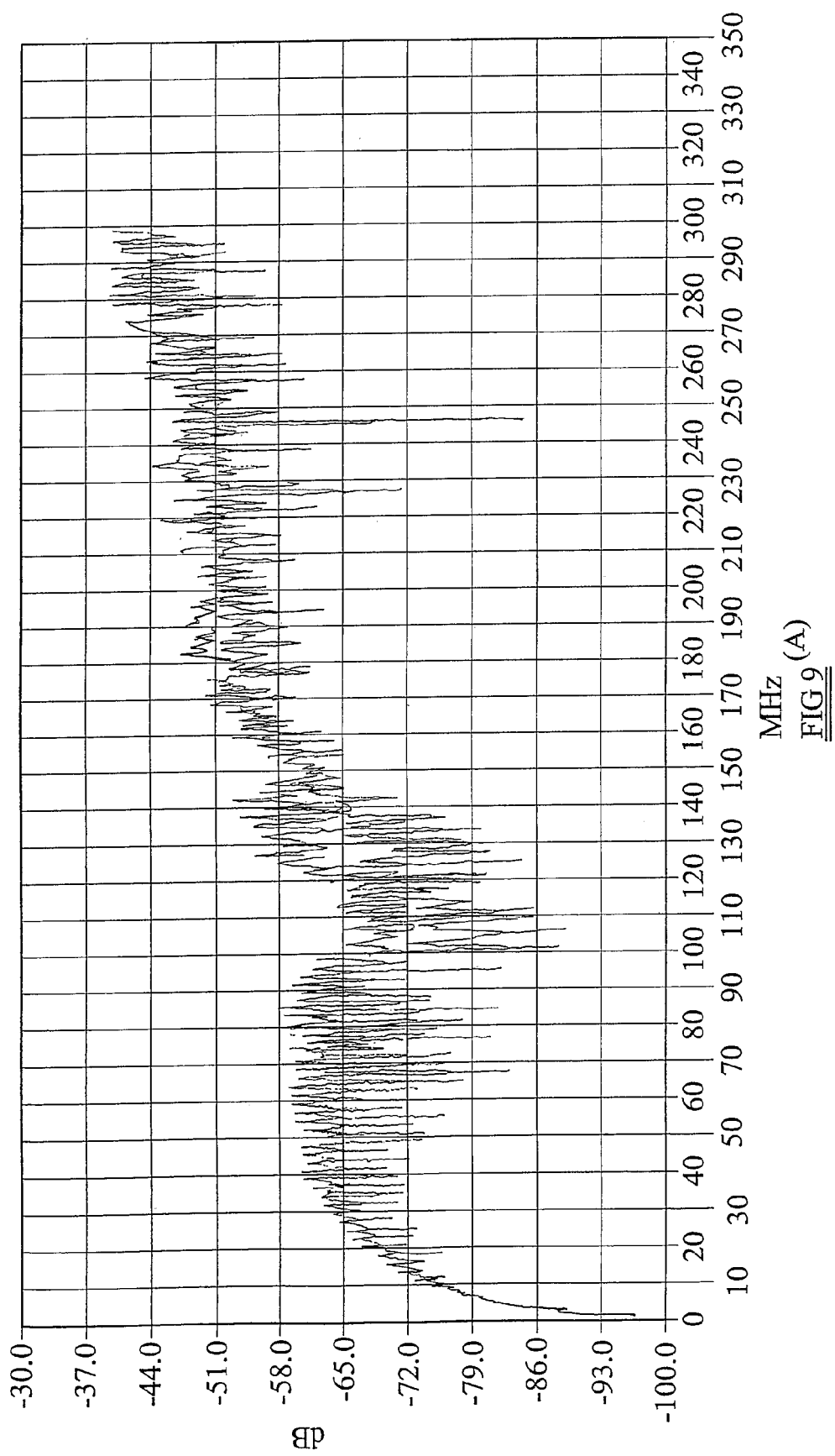
FIGS. 9a and 9b shows traces using the set up of FIG. 8.
Figure 9:
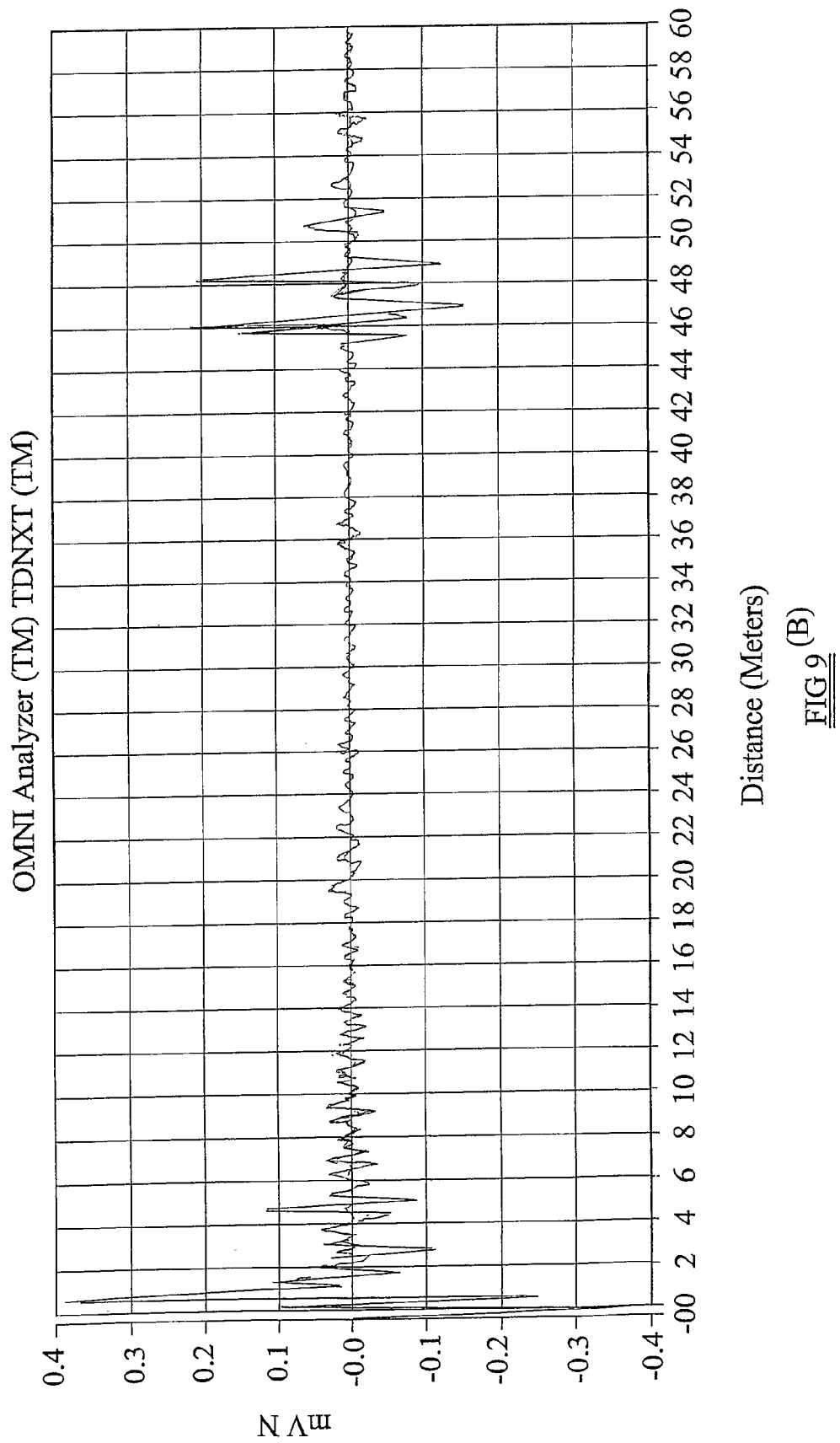
Figure 10:
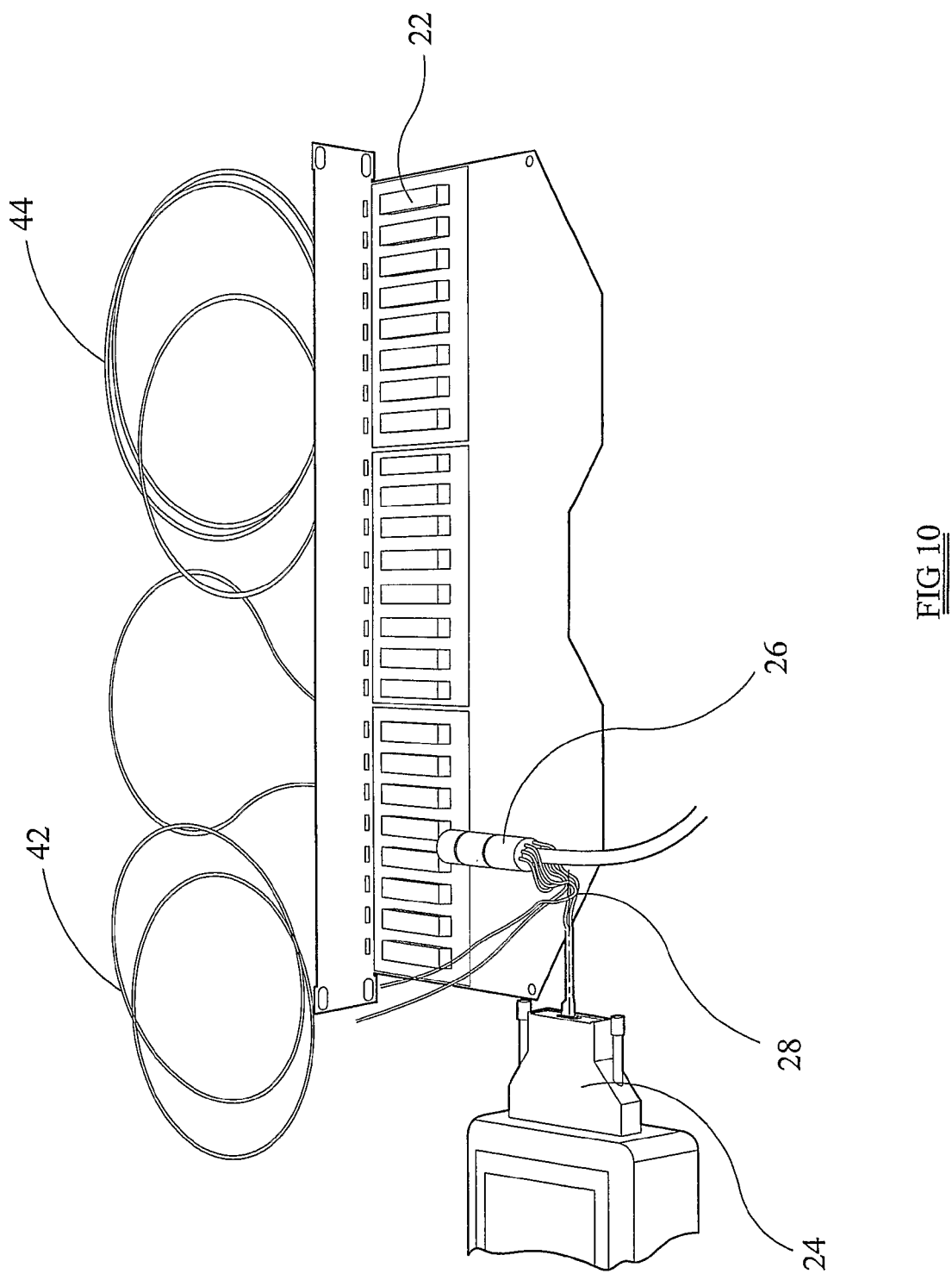
FIG. 10 shows a third modification to the set up of FIG. 4.

A second test was carried out with a fly lead 34 (see FIG. 6) inserted into the outlet end of the cable 20. The results are shown in FIGS. 7a and 7b, which are respectively frequency and time domain plots of the reference test and the fly lead test. As can be seen the end of the cable has moved in the time domain plot to indicate the increase in length of the cable provided by the fly lead.

A third test (see FIG. 8) was carried out with a fly lead 40 inserted into the patch panel end only of the cable 20. The results are shows in FIGS. 9a and 9b, which again are frequency and time domain plots. In the latter two events can be seen at the start of the trace and three ends of the cables as three pulses reach the end of the cable, one from the antennae, one from the patch panel and a reflection from the end of the fly lead 40.

Figure 11A:
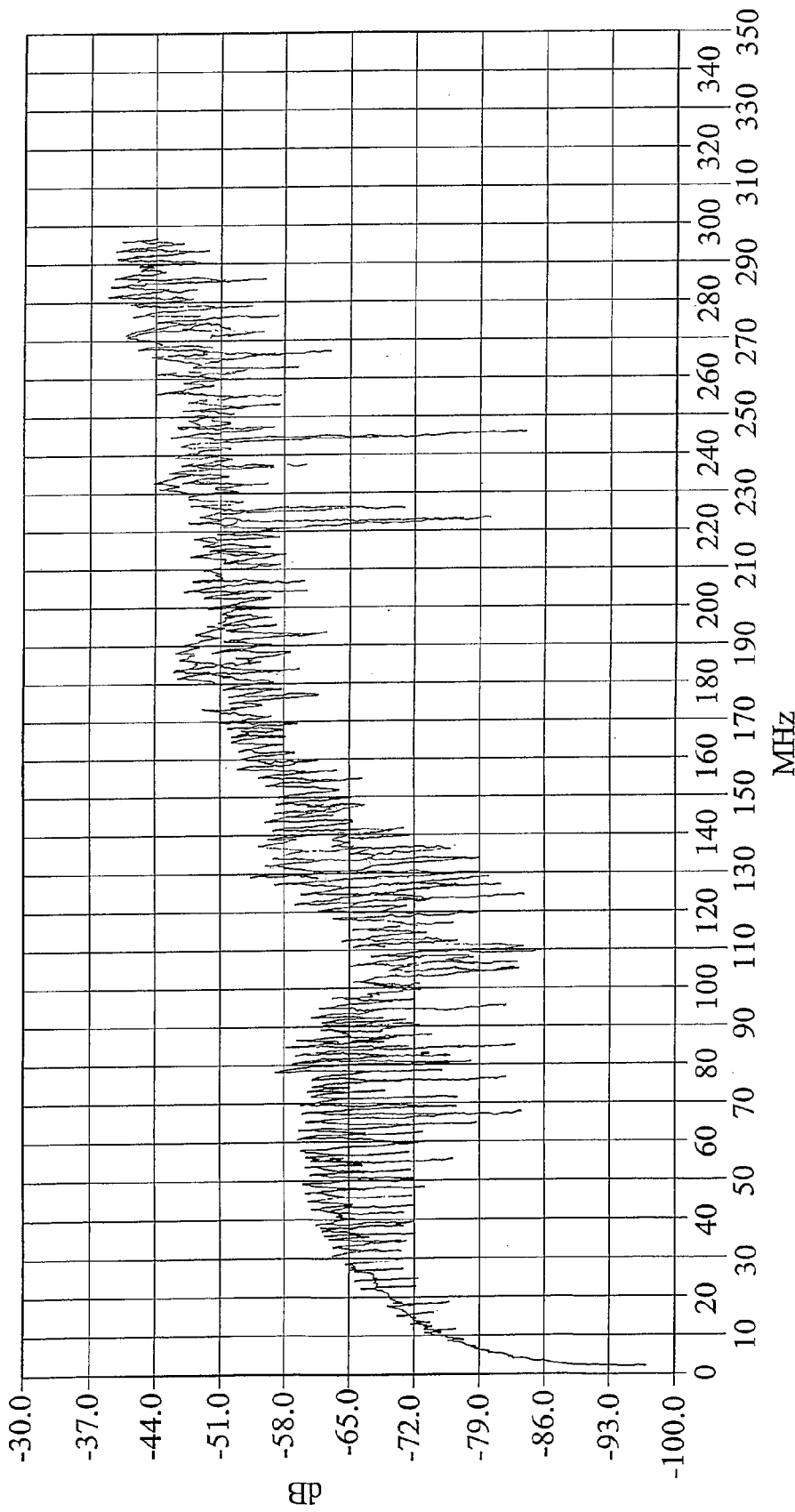
FIGS. 11a and 11b shows traces using the set up of FIG. 10.
Figure 11:
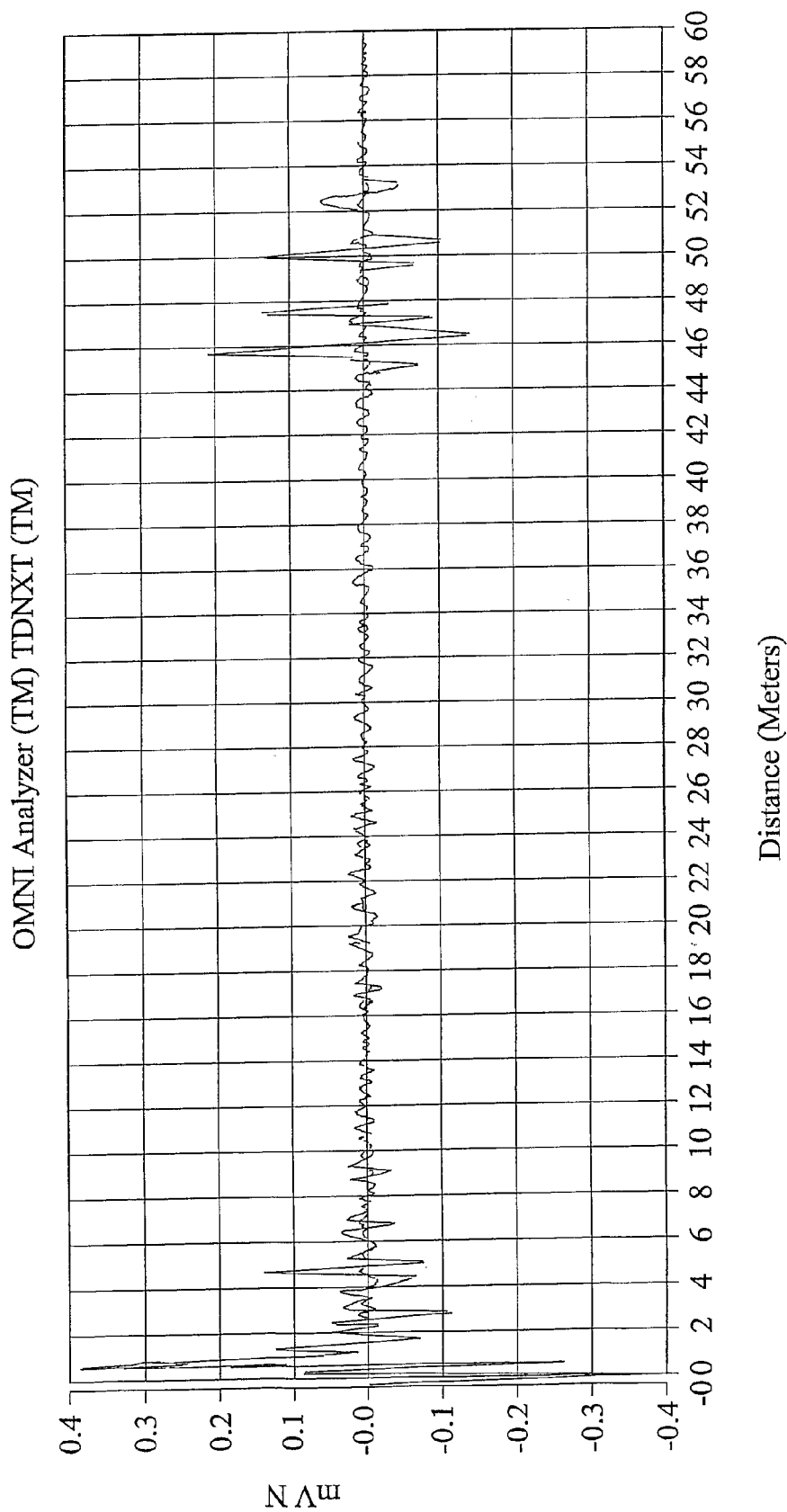

A fourth test (see FIG. 10) was carried out on the cable 20 with fly leads 42 and 44 at each end and the frequency and time domain traces are shown in FIGS. 11a and 11b. The time trace is similar to the patch panel test trace except that the far end signals are displaced past the end of the cable to the end of the fly lead.

Figure 13:
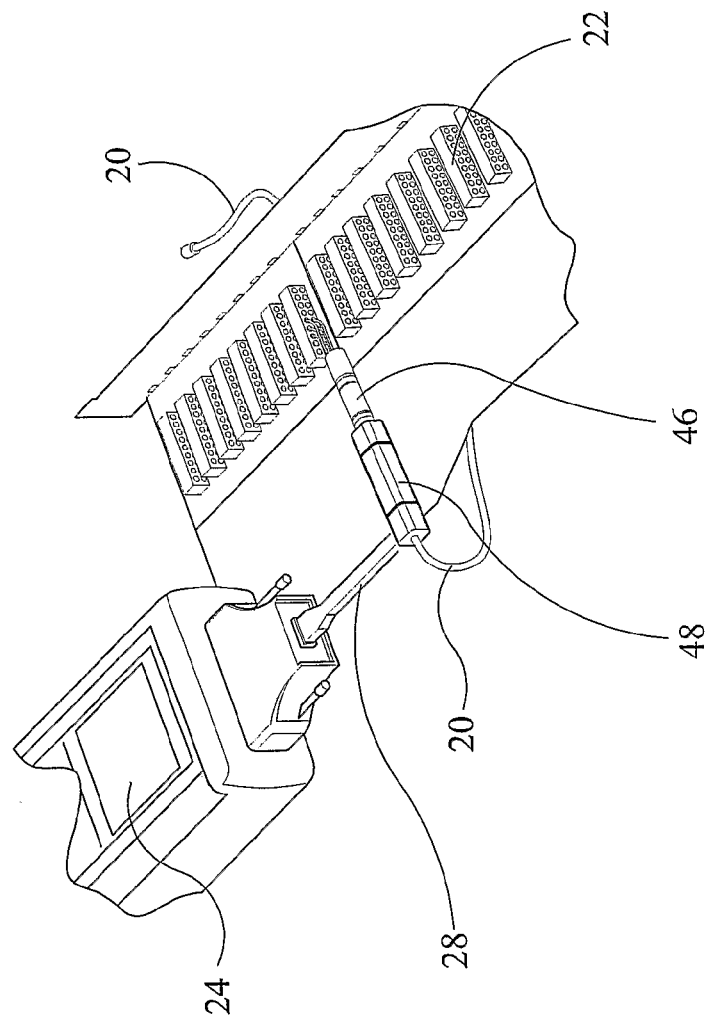
FIG. 13 shows the antennae attached to a cable.
Figure 12:
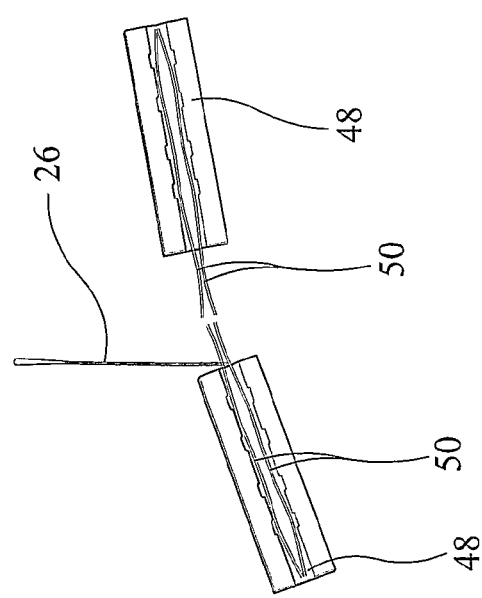
FIG. 12 shows a means of attaching antennae to a cable under test.

FIGS. 12 and 13 of the accompanying drawings show an alternative way of holding the antennae 26 against the cable sheath 46 of a cable 20 under test. A pair of channeled rubber pieces 48 each have a pair of antennae wires 50 arranged therein along opposite edges of the channels and the two channel pieces are then secured around the cable sheath 46 by bands 52 or by any suitable means. The two channel pieces 48 may alternatively be arranged to interlock.

The invention claimed is:

1. A method of determining the state of a cable at least one electrical conductor, in which method a test signal is generated and applied to at least one conductor of the cable by a non-contact electrical coupling transmitter, propagating the resulting signal along the at least one conductor and using a non-contact electrical coupling receiver to pick up a reflected signal, and comparing the reflected signal to expected state signal values for the cable to determine its current state, wherein at least one expected state signal value is stored in memory means, wherein the at least one expected state signal value is the signature for the 'empty' state of the line under test, wherein the expected state signals include port connected and operating, outlet device connected and working, cable damaged, cable disconnected from port and device connected to outlet but not powered up, and wherein the signatures, other than for the 'empty' state, are derived signal values rather than measured reference values.

2. A method as claimed in claim 1, wherein the test signal has an expected signature.

3. A method as claimed in claim 1, wherein a set of expected state signal values for the circuit cable are stored in memory means, with each signal of the set representing a specific state for the respective conductors of the cable under test.

4. A method as claimed in claim 1, wherein the expected state signal values are suitably encoded for storage and/or comparison purposes with the received reflected signals.

5. A method as claimed in claim 1, wherein the received reflected signals are encoded for storage and/or comparison purposes.

6. A method as claimed in claim 1 wherein the comparison is carried out automatically by suitable programming of the test circuitry.

7. A method as claimed in claim 1, in order to extract information from the received signals on the state of the network or system of which the cable is a part, the signals are passed to a signal processing unit.

8. A method as claimed in claim 1, wherein the means for applying a signal to the at least one conductor of the cable comprises an antenna/aerial that is placed adjacent to the circuit under test.

9. A method as claimed in claim 8, wherein the means for applying a signal comprises a wideband aerial.

10. A method as claimed in claim 1, wherein the test signal is frequency based or time based, or a combination of both.

11. A method as claimed in claim 1, wherein the non-contact electrical coupling receiver is an aerial.

12. A method as claimed in claim 11, wherein the non-contact electrical coupling receiver is the same aerial as that which is used to input the signal to the conductor.

13. A method as claimed in claim 1, wherein several aerials are used for each cable.

14. A method as claimed in claim 1, wherein, where a plurality of cables are involved in the network, a plurality of transmitters and receivers or transmitter/receivers are employed.

15. A method as claimed in claim 1, using portable apparatus that is manually positioned adjacent a cable to be tested.

16. A method as claimed in claim 1, wherein the apparatus is permanently installed as part of a network system.

17. A method as claimed in claim 16, using remote network system evaluation.

18. A method as claimed in claim 17, performed off site using a data link, or from a central location on site.

19. A method of determining the state of a cable at least one electrical conductor, in which method a test signal is generated and applied to at least one conductor of the cable by a non-contact electrical coupling transmitter, propagating the resulting signal along the at least one conductor and using a non-contact electrical coupling receiver to pick up a reflected signal, and comparing the reflected signal to expected state signal values for the cable to determine its current state, wherein the propagating and comparing are performed using apparatus, which is permanently installed as part of a network system, and using remote network system evaluation; and said method is performed off site using a data link, or from a central location on site; and, wherein a calibration procedure is carried out to arrive at a set of expected state signal signatures representing the various cable states.

* * * * *

UNITED STATES PATENT AND TRADEMARK OFFICE
CERTIFICATE OF CORRECTION

| | | |
|---|---|---|
| PATENT NO. | : 7,705,606 B2 | Page 1 of 1 |
| APPLICATION NO. | : 11/597575 | |
| DATED | : April 27, 2010 | |
| INVENTOR(S) | : Anthony Joseph Peyton et al. | |

It is certified that error appears in the above-identified patent and that said Letters Patent is hereby corrected as shown below:

Title page, Item (73) Assignee is listed as "Lancaster University Business Enterprises Limited (GB)" it should be -- Cable Sense Limited (UK) --

Signed and Sealed this
Fourth Day of December, 2012

David J. Kappos
*Director of the United States Patent and Trademark Office*